United States Patent [19]

Beyer et al.

[11] 4,264,374

[45] Apr. 28, 1981

[54] CLEANING PROCESS FOR P-TYPE SILICON SURFACE

[75] Inventors: Klaus D. Beyer, Poughkeepsie; Robert H. Kastl, Wappingers Falls, both of N.Y.

[73] Assignee: International Business Machines Corporation, Armonk, N.Y.

[21] Appl. No.: 153,796

[22] Filed: May 28, 1980

Related U.S. Application Data

[63] Continuation of Ser. No. 945,761, Sep. 25, 1978, abandoned.

[51] Int. Cl.$^3$ .................................................. B08B 7/04
[52] U.S. Cl. ............................................ 134/3; 134/4; 134/28; 134/29; 134/30; 148/1.5
[58] Field of Search .................. 134/2, 3, 4, 28, 29, 134/30; 148/1.5

[56] References Cited

U.S. PATENT DOCUMENTS 2,948,642  8/1960  MacDonald .......................... 148/187

OTHER PUBLICATIONS

Kern and Puotinen, "Cleaning Solutions Based on Hydrogen Peroxide . . .", RCA Review, Jun. 1970, pp. 187–206.

Henderson, "Silicon Cleaning With Hydrogen Peroxide Solutions . . .", Journal of the Electrochemical Society, Jun. 1972, pp. 772–775.

Raider, Flitsch, and Palmer, "Oxide Growth of Etched Silicon . . .", Journal of the Electrochemical Society, Mar. 1975, pp. 413–418.

Beyer and Whitehill: ll, "Etching of $SiO_2$ in Gases $HF/H_2O$", IBM Technical Disclosure Bulletin, vol. 19, No. 7, Dec. 1976, p. 2513.

Beyer, "Silicon Surface Cleaning Process", IBM Technical Disclosure Bulletin, vol. 20, No. 5, Oct. 1977, pp. 1746–1747.

Meek, Buck and Gibbon, "Silicon Surface Contamination . . .", Journal of the Electrochemical Society, Sep. 1973, pp. 1241–1242.

*Primary Examiner*—Richard V. Fisher
*Attorney, Agent, or Firm*—Edward S. Gershuny

[57] ABSTRACT

A cleaning process for a silicon surface, especially a p-type silicon surface. The surface is exposed to $HF/H_2O$ fumes, thereby obtaining a hexafluosilicic acid film on the surface. The exposed surface is then treated with a water-based, oxidizing, non-silicon-etchant cleaning agent. There is no intermediate rinse between the latter two steps.

6 Claims, No Drawings

CLEANING PROCESS FOR P-TYPE SILICON SURFACE

This is a continuation of application Ser. No. 945,761 filed Sept. 25, 1978, now abandoned.

BACKGROUND OF THE INVENTION

A typical process for cleaning a silicon surface will utilize successive steps of exposing the surface to liquid HF, rinsing in deionized water and then exposing the surface to a cleaning solution. Silicon substrates that are subjected to such a process typically exhibit a finite amount of carbon contamination.

One known prior art technique for reducing the amount of carbon contamination is, in the initial step mentioned above, to utilize HF vapor instead of HF liquid. Although this lessens the carbon contamination, it does not eliminate it.

The prior art contains suggestions that the carbon contamination may be introduced during the rinse with deionized water. Assuming this is the case of the carbon contamination, the most obvious solution is to eliminate, or at least considerably reduce, the carbon content of the deionized water. However, this would be quite difficult because the very small carbon fragments produced by ion exchange resin columns used in producing deionized water cannot be easily filtered.

Another obvious method of eliminating the carbon from the water would be to produce the water by distillation. However, this is undesirable because distillation consumes a great deal of energy and is quite costly.

In the IBM Technical Disclosure Bulletin, October 1977, pages 1746-1747, K. D. Beyer, one of the inventors of this new cleaning process, suggested that silicon surface cleaning can be achieved by exposing silicon surfaces to $HF/H_2O$ vapor, and then immediately immersing the substrate into a water-based cleaning agent. As part of our invention, we have verified the general correctness of that suggestion, we have discovered the manner in which the cleaning process is dependent upon the doping of the silicon surface and we have discovered various operational parameters related to the process.

DETAILED DESCRIPTION

Silicon surface cleaning consists of three steps:
1. Removal of surface layer (organics, particles, native oxide).
2. Actual cleaning of silicon surface (removal of metallic contamination).
3. Protective coating ($SiO_2$) of "active" silicon surface.

As is well known in the art, an efficient cleaning of silicon surfaces is only possible by removing the $SiO_2$ layer present as native oxide on any silicon surface. A carbon, or carbon/$SiO_2$ mixture, may also be on the silicon surface. If it is, it must also be removed.

The removal of $SiO_2$ and/or carbon can be achieved by exposing dry silicon surfaces to $HF/H_2O$ vapor. The $HF/H_2O$ vapor reacts with $SiO_2$ to form the water-soluble compound hexafluosilicic acid ($H_2SiF_6$) and water. Carbon-silicon bonds on the silicon surface are also broken by the $HF/H_2O$ vapor. By an immediate, successive immersion into a water-based cleaning agent, the hexafluosilicic acid present on the silicon surface dissolves and a bare silicon surface is exposed to the cleaning agent. The cleaning agent can be acidic (for example, HCl solutions), weakly acidic or neutral (for example, EDTA (ethylenediamine tetra acetic acid) solutions), or basic (for example, $NH_4OH$ with $H_2O_2$). As heavy metal impurities in silicon are very detrimental to device yields, cleaning agents are preferably chosen in such a manner that they have good heavy metal complexing capabilities.

After the cleaning, silicon surfaces have to be protected by a thin $SiO_2$ layer in order to prevent a controlled surface contamination of the active, bare silicon surface. For example, following the cleaning solution immersion, the $SiO_2$ coating of silicon surfaces can be easily obtained by immersing silicon wafers into solutions containing oxidative agents, such as $H_2O_2$, $HNO_2$ or $H_2SO_4$ solutions.

In accordance with preferred embodiments of this invention, the cleaning step and $SiO_2$ coating process are combined by choosing cleaning solutions, which contain cleaning and oxidizing agents (such as, for example, 1 part HCl/1 part $H_2O_2$/5 parts $H_2O$ or 1 part $NH_4OH$/1 part $H_2O_2$/5 parts $H_2O$). An improvement prerequisite for a combined cleaning and $SiO_2$ coating process is the slow oxidation of silicon surfaces in order to allocate sufficient time for the cleaning agent/silicon surface interaction, before the oxidizing agent forms the $SiO_2$ layer sealing the silicon surface.

When using our method, it is very important that the initial exposure of the silicon surfaces to HF be to a vapor. It would be undesirable to immerse the silicon into a liquid solution because particles would be released from the silicon surface, move to the surface of the liquid, and then be redeposited upon the silicon surface when the silicon is withdrawn from the liquid. The particles would tend to adhere strongly to the bare silicon surface and, upon subsequent exposure to the laboratory environment, would be locked onto the silicon surface by an encapsulating layer of silicon dioxide and carbon. When the silicon surface is exposed to $HF/H_2O$ vapor, no particles are added or withdrawn. Upon subsequent immersion into the cleaning solution, the encapsulating layer is dissolved and the particles are released. If the solution contains an oxidative agent such as, for example, $H_2O_2$, the silicon surface will be coated with a thin (15-20 Angstrom) $SiO_2$ layer. Upon withdrawal of the silicon through the liquid surface, particles may be redeposited, but these particles will stick to the weakly bonding $SiO_2$ surface, and not to a strongly bonding silicon surface. Particles on the $SiO_2$ surfaces can be more easily removed in successive rinses.

After the formation of the $SiO_2$ coating on the silicon surface, all cleaning sequences are finished by an extensive deionized $H_2O$ rinse and a spin dry operation. Cleaning efficiencies of cleaning sequences can be optimized by selecting suitable cleaning agent concentrations and mixtures of different cleaning agents, by operating at different temperatures, and by varying the intensity of ultrasonic agitation during the cleaning.

Experiments which verify the above descriptions, and which indicate ranges used in this process, are described below.

EXPERIMENTS

A typical situation in semiconductor processing arises from the opening of a diffusion window in a $SiO_2$ masking layer. Therefore, all of the following experiments start with a 1 minute immersion in 10:1 buffered liquid HF solution, containing a trace (as low as 0.00001% by weight) of a copper compound labelled with radioactive $^{64}$Cu, with a subsequent rinse in deionized water (D.I. H$_2$O) and a drying operation. This results in a surface which has carbon contamination on top of the plated Cu metal. This procedure is a very close experimental simulation of a window opening in the SiO$_2$ masking oxide. (Usually the masking oxide has a thickness of about 3500-5000 Angstroms. For safety, a 1000 Angstrom overetch is required. This 1000 Angstrom overetch corresponds to a 1 minute etching time in a 10:1 buffered HF solution.) In all of the following experiments, the wafer front side was bare, while the wafer back is covered by a SiO$_2$ layer of about 4000 Angstroms. No $^{64}$Cu adsorption occurs on SiO$_2$ surfaces. The p-substrates were weakly doped 10-20 ohm-/centimeter 57 mm diameter (100) p-silicon wafers. The n-substrates used were prepared by high concentration arsenic capsule diffusion at 1100° C. ($1 \times 10^{16}$ atoms/cm$^2$ surface concentration, 1.5 micron junction depth) into 10-20 ohm/cm p-silicon wafers.

Prior to cleaning, the wafers have 100% $^{64}$Cu. For each cleaning experiment, the percentage of $^{64}$Cu removed is a measure of the effectiveness of the cleaning process.

The cleaning agents used in these experiments included an ammonia peroxide solution consisting of 5 parts D.I. H$_2$O, 1 part NH$_4$OH 30% and 1 part H$_2$O$_2$ 30% and an HCl peroxide solution consisting of 5 parts D.I. H$_2$O, 1 part HCl 37% and 1 part H$_2$O$_2$ 30%. Ultrasonic agitation in the cleaning solutions was for five minutes. Exposures to HF/H$_2$O vapor were at room temperature. D.I. H$_2$O rinses were at room temperature.

1. Substrates were exposed to HF/H$_2$O vapor (49% HF) for one minute, during which approximately 1000 Angstroms SiO$_2$ were removed. This was followed by immersion in the HCl peroxide solution with ultrasonic agitation at 60° C. $^{64}$Cu removal was 99.5% for p-silicon and 97.4% for n-silicon.

2. Same as experiment 1 except that there was a five minute rinse in D.I. H$_2$O between the exposure to HF/H$_2$O vapor and the HCl peroxide rinse. $^{64}$Cu removal was 80.8% for p-silicon and 94.4% for n-silicon. Comparison of experiments 1 and 2 indicates that the D.I. H$_2$O rinse after HF/H$_2$O vapor exposure causes poor cleaning results, especially for p-silicon.

3. Substrates were exposed for 1 minute to HF/H$_2$O vapor over a solution consisting of 2 parts H$_2$O and 1 part 49% HF. In other words, the concentration of HF was approximately 16%. Oxide removal was approximately 100 Angstroms. This exposure was followed by ultrasonic agitation at 60° C. in the HCl peroxide solution. $^{64}$Cu removal was 98.9% for p-silicon and 98.1% for n-silicon. Comparison with experiment 1 suggests that cleaning of p-silicon is enhanced by greater oxide removel, and cleaning of n-silicon is degraded by greater oxide removal.

4. Substrates were exposed to HF/H$_2$O vapor for 1 minute over a mixture of 49% HF. About 1000 Angstroms of oxide were removed. This was followed by ultrasonic agitation at 60° C. in the ammonia peroxide solution. $^{64}$Cu removal was 98.5% for p-silicon and 98.2% for n-silicon. Comparison with experiments 1 and 3 suggests that the ammonia peroxide solution is superior to the HCl peroxide solution for cleaning n-silicon, and inferior to it for cleaning p-silicon.

5. Same as experiment 4 except that the exposure to HF/H$_2$O vapor is followed by a five minute rinse in D.I. H$_2$O. $^{64}$Cu removal was 78% for p-silicon and 92.2% for n-silicon. This provides further confirmation of the conclusions reached as a result of experiment 2.

6. The three steps of experiment 5 were repeated followed by a second rinse for 5 minutes in D.I. H$_2$O, followed by a 5 minute immersion into the HCl peroxide solution heated to 60° C. and agitated ultrasonically. $^{64}$Cu removal was 77.4% for p-silicon and 98.4% for n-silicon. It is suggested that, with respect to p-silicon, the carbon contamination layer after the first three steps was too thick for the HCl peroxide solution to be able to accomplish any further cleaning. Apparently, it was less thick on the n-silicon and a significant amount of further cleaning was accomplished by the HCl peroxide solution.

7. Substrates were subjected to ultrasonic agitation at 60° C. to a mixture consisting of 5 parts D.I. H$_2$O and 1 part HCl. $^{64}$Cu removal was 79% for p-silicon and 77.5% for n-silicon.

8. The substrates were exposed to HF/H$_2$O vapor for 1 minute over a 49% solution. Approximately 1000 Angstroms of oxide were removed. The substrate was then subjected to ultrasonic agitation at 60° C. in a solution consisting of 5 parts D.I. H$_2$O and 1 part HCl. $^{64}$Cu removal was 98.6% for p-silicon and 91.6% for n-silicon. Comparison with experiment 7 confirms the necessity of prior exposure to the HF/H$_2$O vapor. Comparison with experiment number 1 shows the value of including H$_2$O$_2$ in the cleaning solution.

9. Substrates were subjected to ultrasonic agitation at 60° C. in the HCl peroxide solution. $^{64}$Cu removal was 74% for p-silicon and 92.4% for n-silicon. Comparison with experiment number 1 confirms the conclusion that prior treatment with HF/H$_2$O vapor is necessary.

10. Substrates were subjected to ultrasonic agitation at 60° C. in the ammonia peroxide solution. $^{64}$Cu removal was 91.8% for the p-silicon and 97.8% for n-silicon. Comparison with experient 4 provides further confirmation of the necessity of prior exposure to HF/H$_2$O vapor, especially with respect to p-silicon.

11. Experiment 4 was repeated, except that the cleaning solution was at 35° C. $^{64}$Cu removal was 98.6% for p-silicon and 95.7% for n-silicon. Comparison with experiment 4 suggests that, within the limits used, temperature is not critical when cleaning p-silicon but is of significance when cleaning n-silicon.

12. Experiment 1 was performed except that the cleaning solution was at 35° C. $^{64}$Cu removal was 99.3% for p-silicon and 98.2% for n-silicon. Comparison with experiment 1 suggests that, within the range of temperatures utilized, temperature is not critical when cleaning p-silicon or n-silicon with this process using the HCl peroxide solution.

Although the cleaning solutions used in the above experiments were ammonia peroxide solutions and HCl peroxide solutions, those skilled in the art will recognize that other water-based, non-silicon etchant, oxidizing cleaning agents would be expected to perform satisfactorily. For example, there are sulfuric peroxide, sulfuric acids and nitric acid cleaning solutions that were not tested by us but should be satisfactory.

Those skilled in the art will also recognize that, although the silicon is to be exposed to HF/H$_2$O vapor, it is not essential that the solution producing the vapor be a mixture of HF and H$_2$O. For example, the solution could be a concentrated H$_2$SiF$_6$ solution, which during evaporation emits HF/H$_2$O vapor.

While the invention has been described with reference to preferred embodiments thereof, it will be understood by those skilled in the art that the above and other changes may be made therein without departing from the spirit and scope of the invention.

Having thus described our invention, what we claim as new, and desire to secure by Letters Patent is:

1. A method of cleaning a p-type silicon surface comprising the steps of:
    (1) exposing said surface to $HF/H_2O$ vapor thereby obtaining a water soluble film on said surface; and
    (2) treating the exposed surface and dissolving said water soluble film with a water-based, oxidizing, non-silicon-etchant cleaning agent which removes heavy metal from a silicon surface, without an intermediate rinse.

2. The method of claim 1 wherein the concentration of HF is approximately within the range of 16% to 49%.

3. The method of claim 2 wherein:
the cleaning agent is selected from the group consisting of
a mixture of deionized $H_2O$, $NH_4OH$ and $H_2O_2$, and
a mixture of deionized $H_2O$, HCl and $H_2O_2$.

4. The method of claim 3 wherein:
said first-mentioned cleaning agent consists of approximately 5 parts deionized $H_2O$, 1 part of a 30% solution of $NH_4OH$ and 1 part of a 30% solution of $H_2O_2$; and
said second-mentioned cleaning agent consists of approximately 5 part deionized $H_2O$, 1 part 37% solution HCl and 1 part 30% solution $H_2O_2$.

5. The method of claim 1 wherein:
said exposing step has a duration of approximately one minute.

6. The method of claim 1 wherein:
said treating step takes place at a temperature in the range of approximately 35° C. to 60° C.

* * * * *